(12) United States Patent
Wu (10) Patent No.: US 7,307,315 B2
(45) Date of Patent: Dec. 11, 2007

(54) SCALABLE PLANAR DMOS TRANSISTOR STRUCTURE AND ITS FABRICATING METHODS

(75) Inventor: Ching-Yuan Wu, Hsinchu (TW)

(73) Assignee: Silicon-Based Technology Corp., Hsinchu (TW)

( * ) Notice: Subject to any disclaimer, the term of this patent is extended or adjusted under 35 U.S.C. 154(b) by 368 days.

(21) Appl. No.: 11/014,836

(22) Filed: Dec. 20, 2004

(65) Prior Publication Data

US 2006/0131646 A1    Jun. 22, 2006

(51) Int. Cl.
*H01L 29/94* (2006.01)
(52) U.S. Cl. ..................................... 257/335
(58) Field of Classification Search ................. 257/335
See application file for complete search history.

*Primary Examiner*—Carl Whitehead, Jr.
*Assistant Examiner*—Monica D. Harrison
(74) *Attorney, Agent, or Firm*—Pai Patent & Trademark Law Firm (57) ABSTRACT

The scalable planar DMOS transistor structure of the present invention comprises a scalable source region surrounded by a planar gate region. The scalable source region comprises a p-base diffusion region being formed in a $n^-$ epitaxial semiconductor layer through a ring-shaped implantation window, a $n^+$ source diffusion ring being formed in a surface portion of the p-base diffusion region through the ring-shaped implantation window, a $p^+$ contact diffusion region being formed in a middle semiconductor surface portion through a self-aligned implantation window being surrounded by the ring-shaped implantation window, and a self-aligned source contact window being formed on the $p^+$ contact diffusion region and the $n^+$ source diffusion ring surrounded by a sidewall dielectric spacer. The planar gate region comprises a patterned heavily-doped polycrystalline-silicon gate layer being formed on a gate dielectric layer and capped locally with or without metal silicide layers.

9 Claims, 7 Drawing Sheets

SCALABLE PLANAR DMOS TRANSISTOR STRUCTURE AND ITS FABRICATING METHODS

BACKGROUND OF THE INVENTION

1. Field of the Invention

The present invention relates generally to a planar DMOS power transistor and its manufacturing method and, more particularly, to a scalable planar DMOS transistor structure being fabricated without using critical masking photoresist steps.

2. Description of the Prior Art

Figure 1:
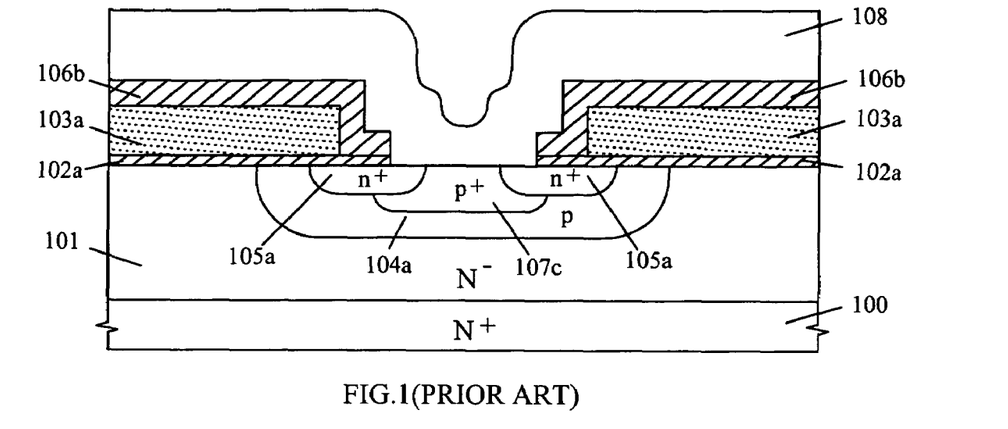
FIG. 1 shows a schematic cross-sectional view of a prior-art planar DMOS transistor structure.
Figure 2A:
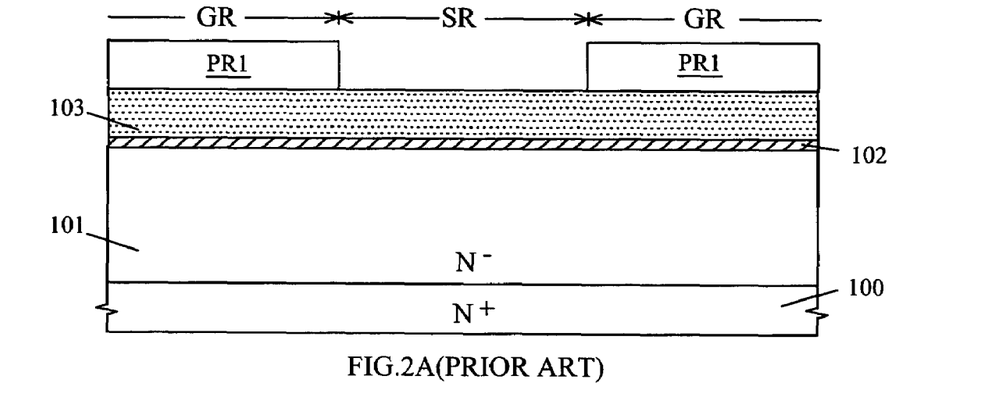
FIG. 2A through FIG. 2E show simplified process steps and their schematic cross-sectional views of fabricating the prior-art planar DMOS transistor structure shown in FIG. 1.
Figure 2B:
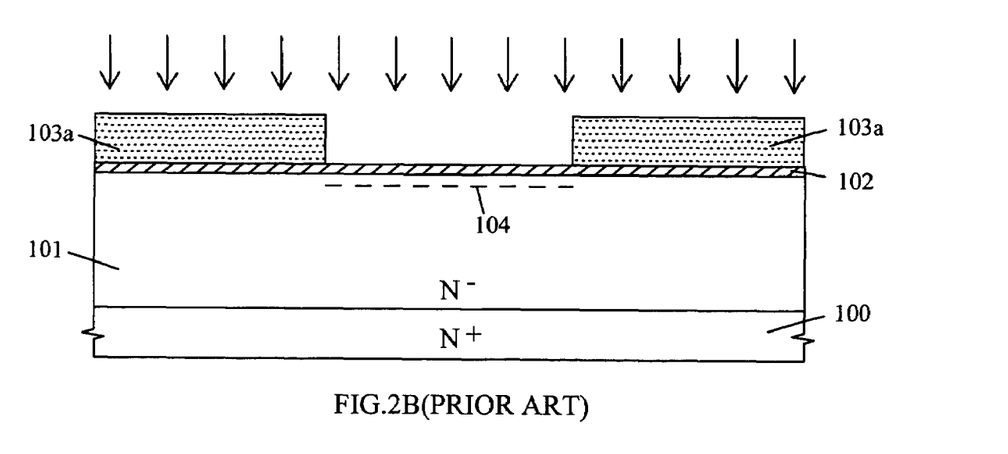
Figure 2C:
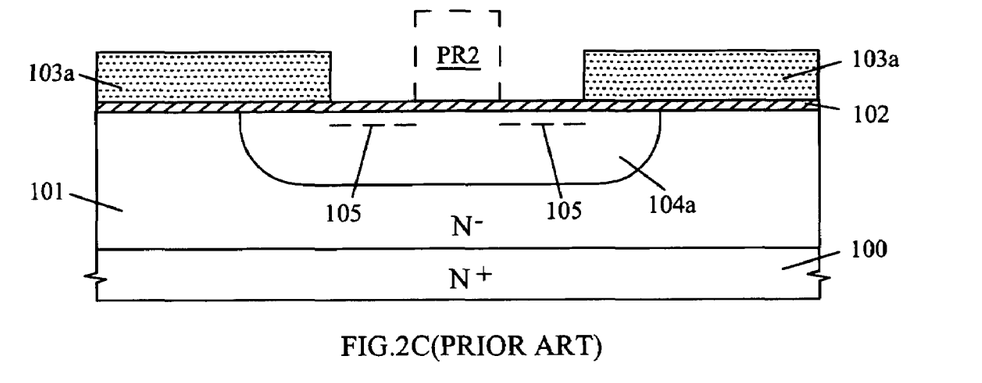
Figure 2D:
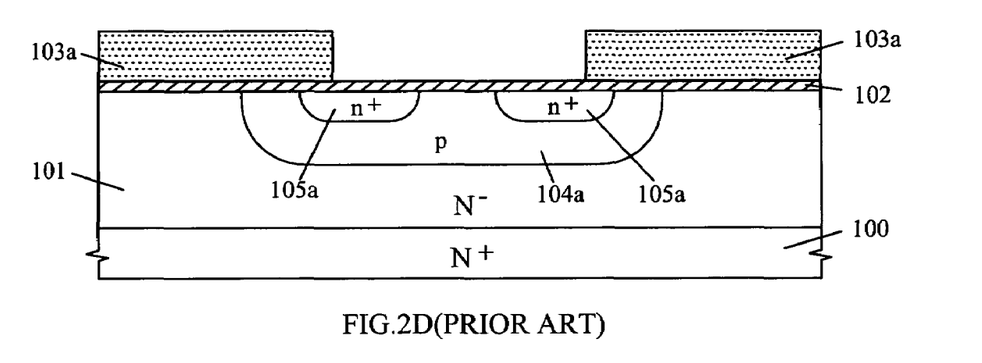
Figure 2E:
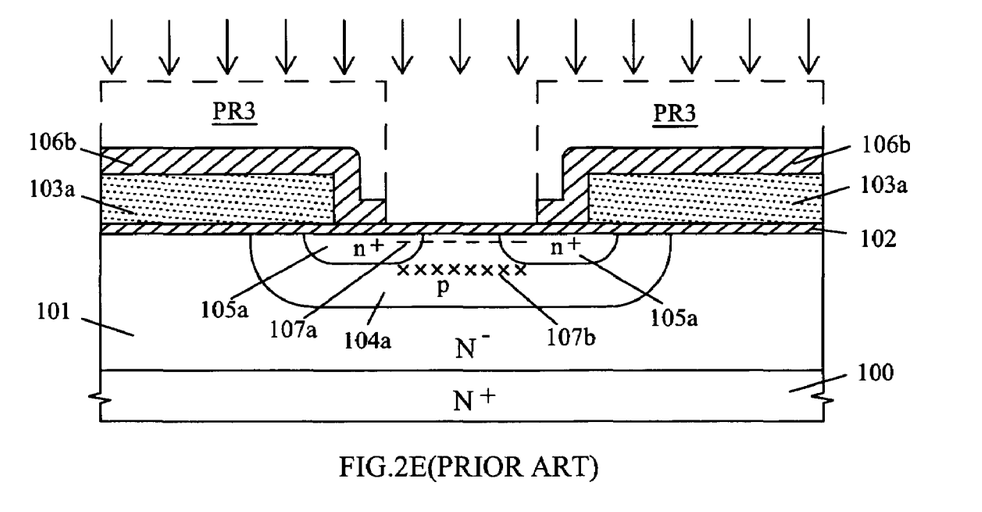

A conventional planar DMOS (double-diffused MOS) power transistor comprises a plurality of source regions being formed in a lightly-doped epitaxial semiconductor layer, wherein each of the plurality of source regions is formed to be surrounded by a planar gate region. A typical example can refer to FIG. 1, wherein the planar gate region comprises a doped polycrystalline-silicon layer 103a being formed on a gate-oxide layer 102a by using a first masking photoresist (PR1) step, as shown in FIG. 2A; the source region (SR) comprises a moderately-doped p-base diffusion region 104a being formed in the lightly-doped $N^-$ epitaxial silicon layer 101 through a first implantation window as shown in FIG. 2B; a heavily-doped $n^+$ source diffusion ring 105a is formed in a surface portion of the moderately-doped p-base diffusion region 104a through a second implantation window between a patterned photoresist layer (PR2) and the patterned doped polycrystalline-silicon layer 103a by using a second masking photoresist (PR2) step as shown in FIG. 2C; a heavily-doped $p^+$ diffusion region 107c being formed in a middle surface portion of the moderately-doped p-base diffusion region 104a through a contact window surrounded by a patterned interlayer oxide layer 106b by using a third masking photoresist (PR3) step as shown in FIG. 2E; and a source metal layer 108 is formed over the contact window and the patterned interlayer oxide layer 106b.

From the process steps and their schematic cross-sectional views shown in FIG. 2A through FIG. 2E, it is clearly seen that the second and third masking photoresist steps are critical masking photoresist steps and misalignments are inevitable, especially as source area is scaled down. Moreover, the patterned doped polycrystalline-silicon layer 103a is acted as a gate-interconnection conductive layer; higher gate-interconnection parasitic resistance may reduce switching speed of a planar DMOS power transistor.

It is, therefore, a major objective of the present invention to offer a scalable planar DMOS transistor structure being fabricated without critical masking photoresist steps to eliminate all deterioration effects due to misalignments of critical masking photoresist steps.

It is another objective of the present invention to offer a scalable planar DMOS transistor structure with a scalable source area to minimize cell size of a planar DMOS transistor cell.

It is a further objective of the present invention to offer a scalable planar DMOS transistor structure with a patterned heavily-doped polycrystalline-silicon gate layer being locally silicided with metal silicide layers to reduce gate-interconnection parasitic resistance.

SUMMARY OF THE INVENTION

The present invention discloses a scalable planar DMOS transistor structure and its fabrication methods. The scalable planar DMOS transistor structure of the present invention comprises a scalable source region and a planar gate region, wherein the scalable source region is surrounded by the planar gate region. The scalable source region comprises a moderately-doped p-base diffusion region being formed in a lightly-doped $N^-$ epitaxial semiconductor layer through a ring-shaped implantation window, a heavily-doped $n^+$ source diffusion ring being formed in a surface portion of the moderately-doped p-base diffusion region through the ring-shaped implantation window, a heavily-doped $p^+$ contact diffusion region being formed in a middle semiconductor surface portion through a self-aligned implantation window surrounded by a sacrificial dielectric layer formed in the ring-shaped implantation window, and a self-aligned source contact window being formed on the heavily-doped $p^+$ contact diffusion region and the heavily-doped $n^+$ source diffusion ring surrounded by a sidewall dielectric spacer. The ring-shaped implantation window is formed by patterning a capping dielectric layer on a heavily-doped polycrystalline-silicon layer through a first masking photoresist (PR1) step. The sacrificial dielectric layer is formed to fill a gap in the ring-shaped implantation window after forming the heavily-doped $n^+$ source diffusion ring and is removed after performing implantation for forming the heavily-doped $p^+$ contact diffusion region. The self-aligned implantation window is formed by removing a patterned capping dielectric layer on a patterned heavily-doped polycrystalline-silicon gate layer surrounded by the sacrificial dielectric layer through a second masking photoresist (PR2) step with a second masking photoresist (PR2) being formed on the patterned capping dielectric layer in the planar gate region and a portion of the sacrificial dielectric layer. The sidewall dielectric spacer is formed over a sidewall of the patterned capping dielectric layer on the patterned heavily-doped polycrystalline-silicon gate layer in the planar gate region and on a side portion of a gate dielectric layer in the scalable source region or is formed over a sidewall of a protection dielectric layer being formed over a sidewall of the patterned capping dielectric layer on the patterned heavily-doped polycrystalline-silicon gate layer and on a side portion of the protection dielectric layer on a gate dielectric layer in the scalable source region. The planar gate region comprises the patterned heavily-doped polycrystalline-silicon gate layer on the gate dielectric layer and the patterned capping dielectric layer being formed on the patterned heavily-doped polycrystalline-silicon gate layer, wherein the patterned heavily-doped polycrystalline-silicon gate layer can be locally silicided with metal silicide layers through gaps formed in the patterned capping dielectric layer and refilled dielectric layers are formed to fill the gaps.

The scalable planar n-channel DMOS transistor structure as described above can be easily extended to form a scalable planar p-channel DMOS transistor structure by changing doping types in semiconductor regions. Moreover, the scalable planar DMOS transistor structure as described can be easily applied to form insulated-gate bipolar transistors (IGBT) or MOS-controlled thyristors (MCT).

DETAILED DESCRIPTION OF THE PREFERRED EMBODIMENTS

Referring now to FIG. 3A through FIG. 3H, there are shown process steps and their schematic cross-sectional views of fabricating a first-type scalable planar DMOS transistor structure of the present invention.

Figure 3A:
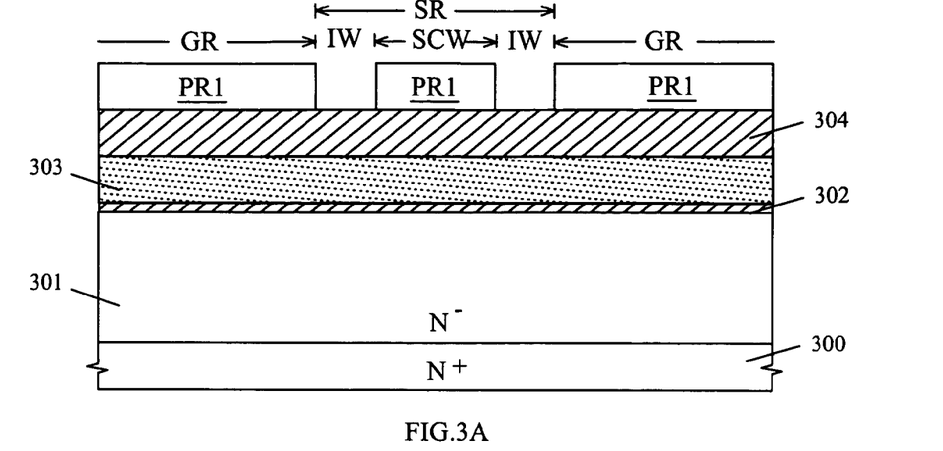
FIG. 3A through FIG. 3H show process steps and their schematic cross-sectional views of fabricating a first-type scalable planar DMOS transistor structure of the present invention.

FIG. 3A shows that a gate dielectric layer 302 is formed on a lightly-doped N$^-$ epitaxial silicon layer 301 formed on a heavily-doped N$^+$ silicon substrate 300; a heavily-doped polycrystalline-silicon layer 303 is then formed on the gate dielectric layer 302; subsequently, a capping dielectric layer 304 is formed on the heavily-doped polycrystalline-silicon layer 303; and thereafter, a first masking photoresist (PR1) step is performed to define a ring-shaped implantation window (IW). The heavily-doped N$^+$ silicon substrate 300 is preferably with a resistivity between 0.001 Ω*cm and 0.004 Ω*cm and a thickness between 250 μm and 800 μm, depending on wafer size. The lightly-doped N$^-$ epitaxial silicon layer 301 is preferably with a resistivity between 0.1 Ω*cm and 100 Ω*cm and a thickness between 1 μm and 100 μm. The gate dielectric layer 302 is preferably a thermal silicon dioxide layer or a thermal silicon dioxide layer nitrided in a N$_2$O ambient and its thickness is preferably between 100 Angstroms and 1000 Angstroms. The heavily-doped polycrystalline-silicon layer 303 is preferably deposited by low-pressure chemical vapor deposition (LPCVD) and its thickness is preferably between 3000 Angstroms and 7000 Angstroms, and can be heavily-doped by in-situ, ion implantation or a conventional thermal diffusion process. The capping dielectric layer 304 is preferably made of silicon dioxide as deposited by LPCVD and its thickness is preferably between 4000 Angstroms and 10000 Angstroms.

Figure 3B:
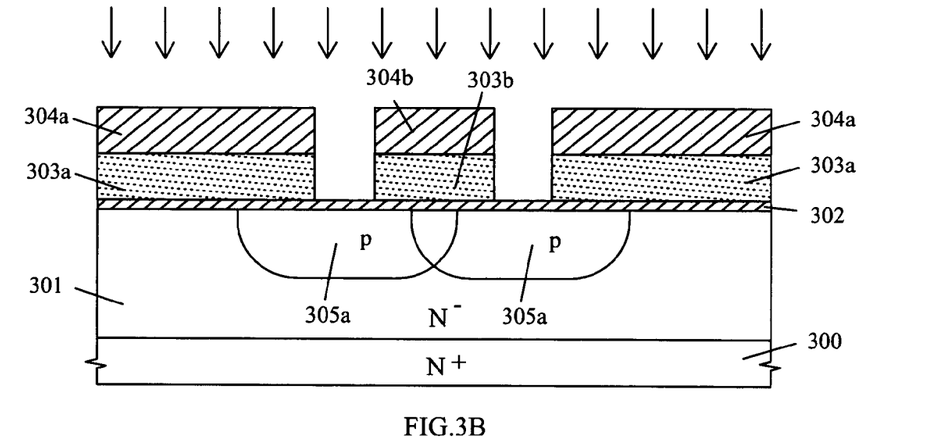

FIG. 3B shows that the capping dielectric layer 304 and the heavily-doped polycrystalline-silicon layer 303 outside of the first masking photoresist (PR1) are then sequentially removed by anisotropic dry etching and the first masking photoresist (PR1) are then stripped; and subsequently, boron ion-implantation is performed to form a p-diffusion ring 305a in the lightly-doped N$^-$ epitaxial silicon layer 301. It is clearly seen that an extension portion of the p-diffusion ring 305a is cross-coupled to form a moderately-doped p-base diffusion region 305b shown in FIG. 3C. It should be emphasized that the degree of cross-coupled p-diffusion ring 305a can be varied; a diffused structure of the moderately-doped p-base diffusion region 305b is only an example.

Figure 3C:
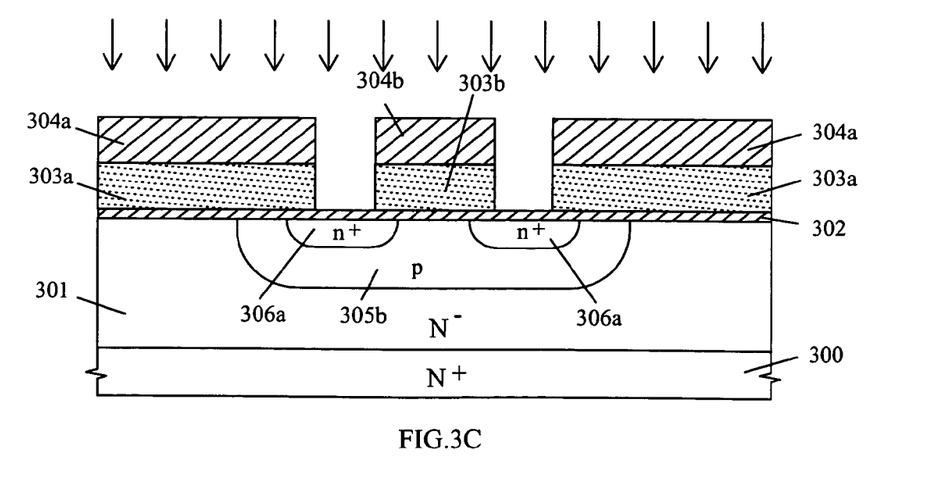

FIG. 3C shows that a heavily-doped n+ source diffusion ring 306a is formed in a surface portion of the moderately-doped p-base diffusion region 305b through the same ring-shaped implantation window (IW).

Figure 3D:
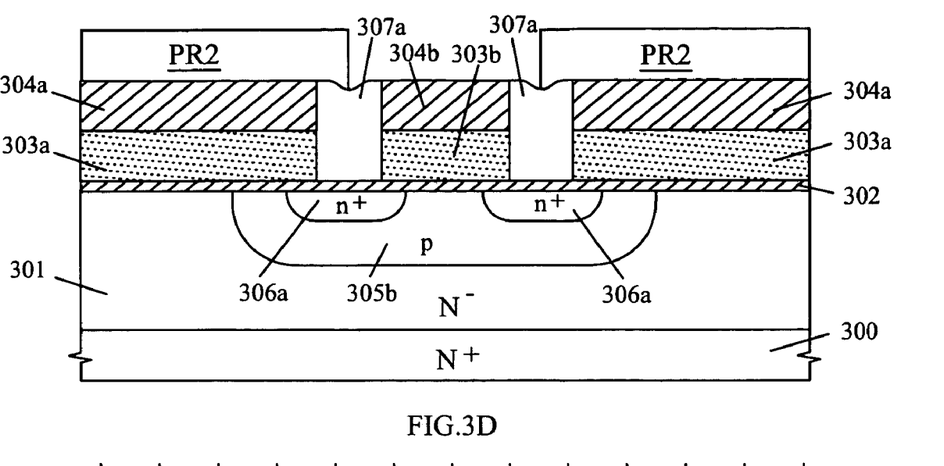

FIG. 3D shows that a sacrificial dielectric layer 307a is formed to fill a gap in the ring-shaped implantation window (IW); and subsequently, a second masking photoresist (PR2) step is performed to form a second masking photoresist (PR2) on the planar gate region (GR) and a portion of the sacrificial dielectric layer 307a. The sacrificial dielectric layer 307a is preferably made of silicon nitride as deposited by LPCVD and is formed by first depositing a silicon nitride layer 307 (not shown) with a thickness approximately equal to or larger than one half width of the ring-shaped implantation window (IW) and then etching back a thickness of the deposited silicon nitride layer 307.

Figure 3E:
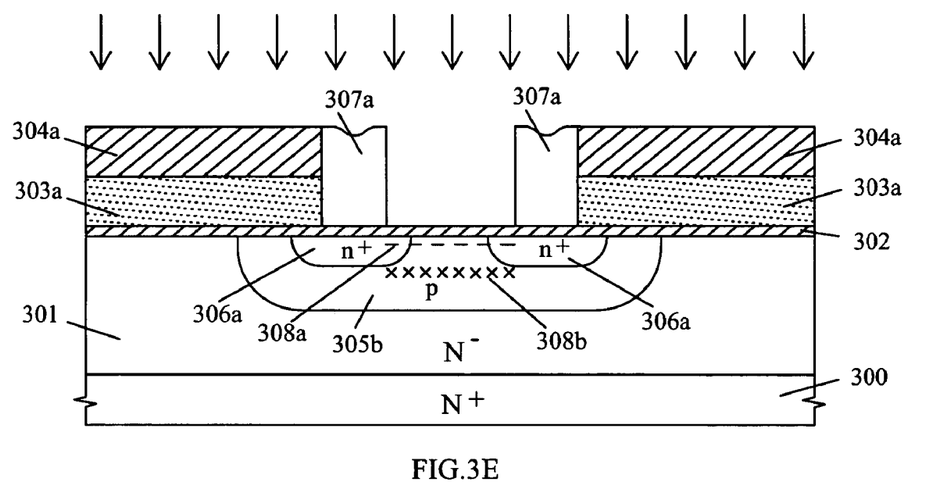

FIG. 3E shows that the patterned capping dielectric layer 304b surrounded by the sacrificial dielectric layer 307a is first removed by buffered hydrofluoric acid or anisotropic dry etching and the patterned heavily-doped polycrystalline-silicon gate layer 303b is then removed by anisotropic dry etching; subsequently, the second masking photoresist (PR2) is removed; and thereafter, boron ion-implantations can be performed through a self-aligned implantation window (SCW) being surrounded by the sacrificial dielectric layer 307a to form a shallow implant region 308a using low-energy implantation and a deeper implant region 308b using high-energy implantation.

Figure 3F:
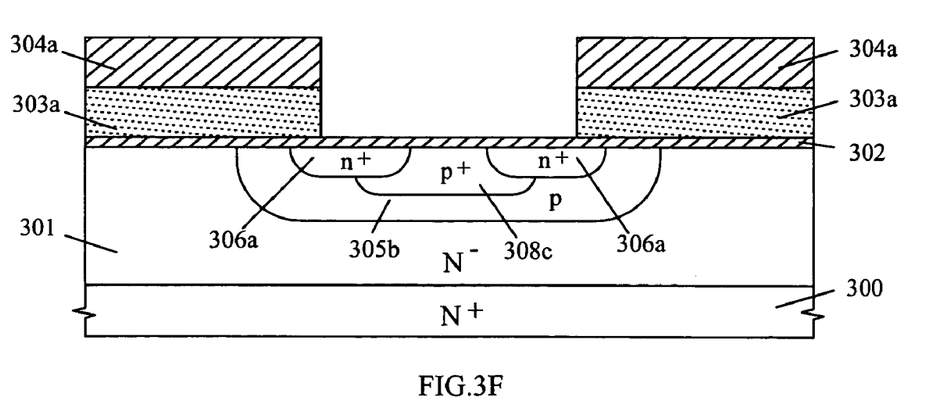

FIG. 3F shows that the sacrificial dielectric layer 307a is removed by using hot-phosphoric acid; and a thermal annealing process is then performed to activate or redistribute the shallow implant region 308a and the deeper implant region 308b into a heavily-doped p$^+$ contact diffusion region 308c.

Figure 3G:
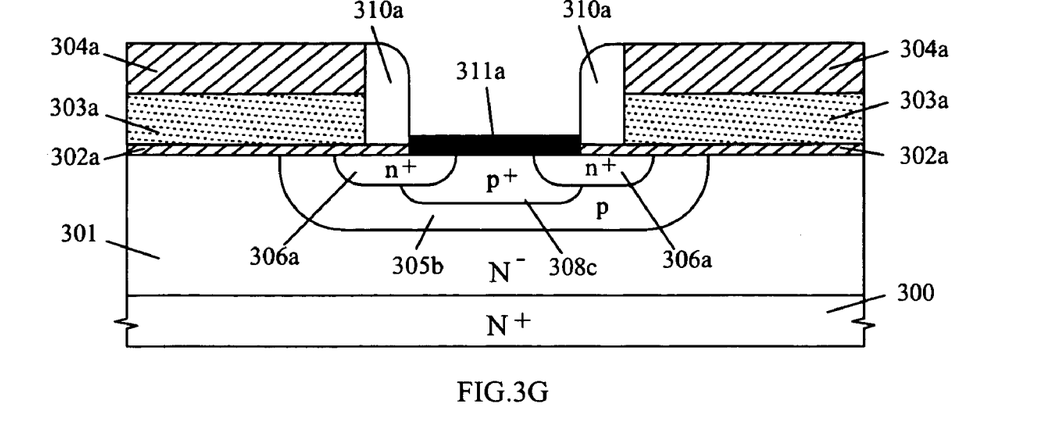

FIG. 3G shows that a sidewall dielectric spacer 310a is formed over a sidewall of the patterned capping dielectric layer 304a on the patterned heavily-doped polycrystalline-silicon gate layer 303a in the planar gate region (GR) and on a side surface portion of the gate dielectric layer 302 in the scalable source region (SR); the gate dielectric layer 302 surrounded by the sidewall dielectric spacer 310a is then removed to form a self-aligned source contact window; and subsequently, a self-aligned metal silicide layer 311a is formed over the self-aligned source contact window by using a well-known self-aligned silicidation process. The sidewall dielectric spacer 310a is preferably made of silicon nitride as deposited by LPCVD and is formed by first depositing a silicon nitride layer 310 (not shown) over a formed structure surface and then etching back a thickness of the deposited silicon nitride layer 310. The self-aligned metal silicide layer 311a is preferably a refractory metal silicide layer. It should be noted that the sidewall dielectric spacer 310a can be made of silicon dioxide as deposited by LPCVD.

Figure 3H:
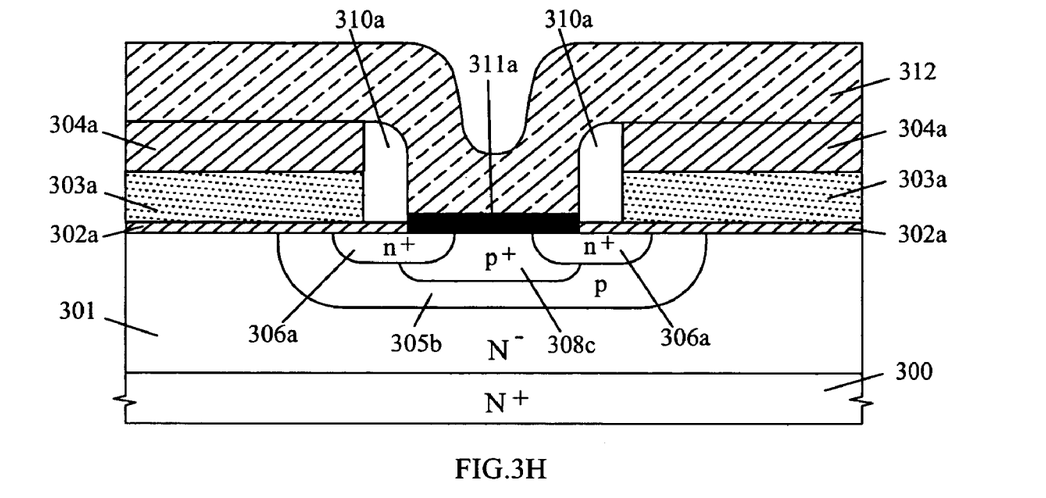

FIG. 3H shows that a source metal layer 312 is formed over the self-aligned metal silicide layer 311a, and the sidewall dielectric spacer 310a in the scalable source region (SR) and the patterned capping dielectric layer 304a in the planar gate region (GR). The source metal layer 312 comprises a metal layer over a barrier metal layer.

From FIG. 3H, it is clearly seen that the heavily-doped n$^+$ source diffusion ring 306a is formed through a ring-shaped implantation window (IW), the heavily-doped p$^+$ contact diffusion region 308c is formed through a self-aligned implantation window (SCW) surrounded by the sacrificial dielectric layer 307a in the ring-shaped implantation window (IW), and the self-aligned source contact window is formed in a middle semiconductor surface surrounded by the sidewall dielectric spacer in the scalable source region (SR). Apparently, there is no critical masking photoresist step used and misalignments involved in the prior art are eliminated.

More importantly, the ruggedness of the fabricated planar DMOS transistor can be easily obtained by the present invention.

Figure 4A:
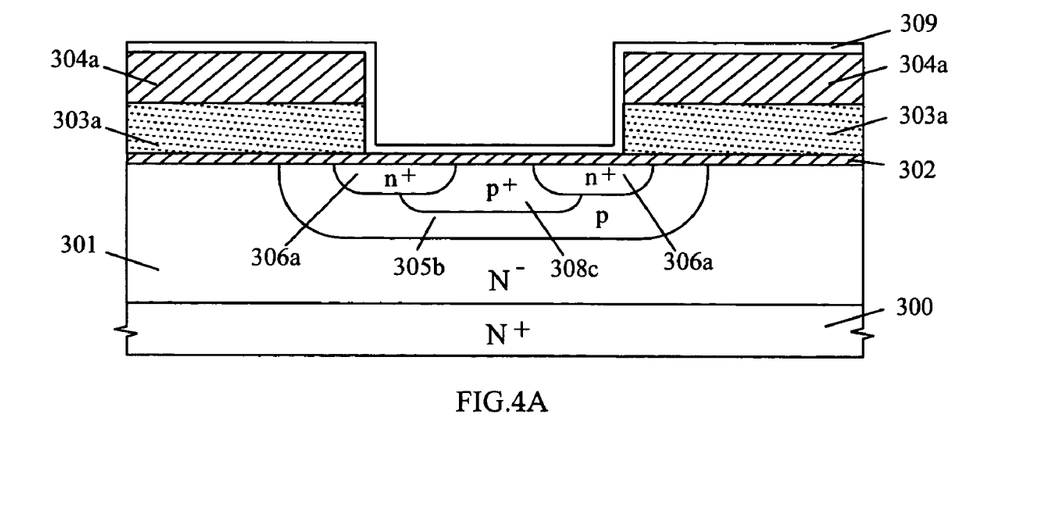
FIG. 4A through FIG. 4C show simplified process steps after FIG. 3F and their schematic cross-sectional views of fabricating a second-type scalable planar DMOS transistor structure of the present invention.
Figure 4B:
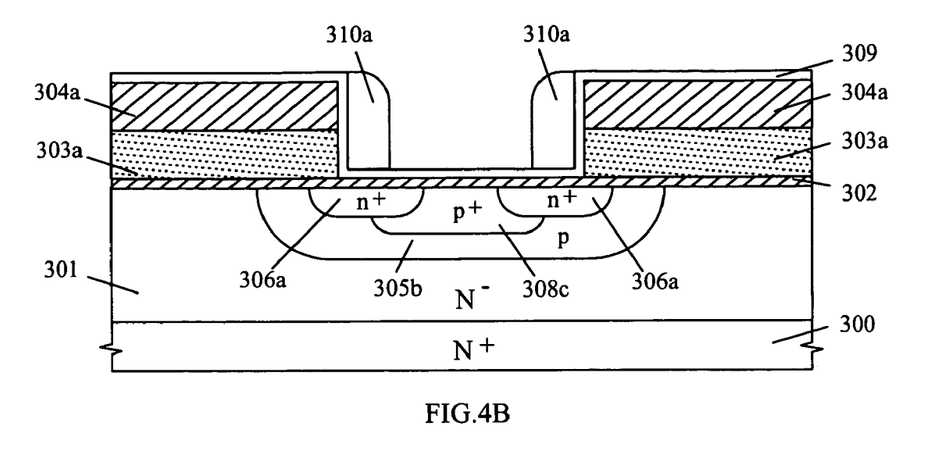
Figure 4C:
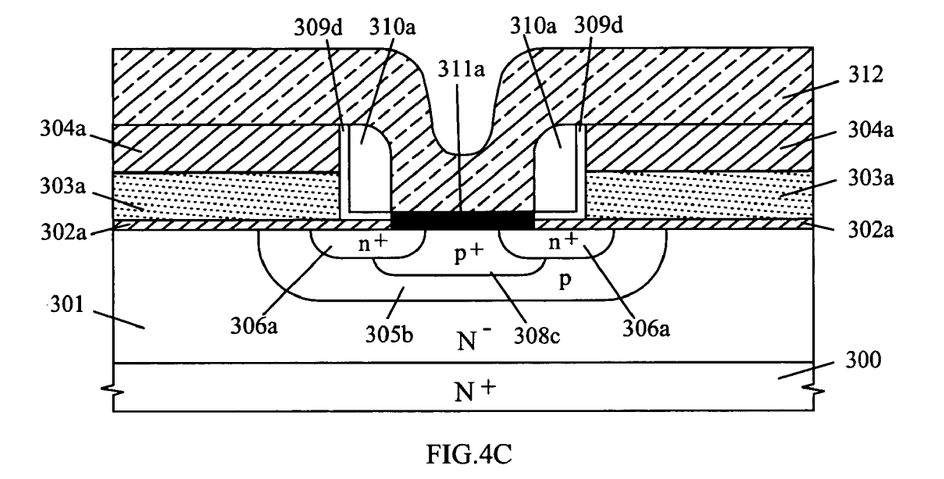

Referring now to FIG. 4A through FIG. 4C, there are shown simplified process steps after FIG. 3F and their schematic cross-sectional views of fabricating a second-type scalable planar DMOS transistor structure of the present invention.

FIG. 4A shows that a protection dielectric layer 309 is formed over the formed structure surface shown in FIG. 3F. The protection dielectric layer 309 is preferably made of silicon nitride as deposited by LPCVD and its thickness is preferably between 100 Angstroms and 1000 Angstroms.

FIG. 4B shows that a sidewall dielectric spacer 310a is formed over a sidewall of the protection dielectric layer 309 and on a side portion of the protection dielectric layer 309. The sidewall dielectric spacer 310a is preferably made of silicon dioxide as deposited by LPCVD and is formed by first depositing a silicon dioxide layer 310 (not shown) over the protection dielectric layer 309 and then etching back a thickness of the deposited silicon dioxide layer 310.

FIG. 4C shows that the protection dielectric layer 309 is etched back by using the anisotropic dry etching and the gate dielectric layer 302 surrounded by the sidewall dielectric spacer 310a is removed by anisotropic dry etching or dipping in a dilute hydrofluoric acid to form a self-aligned source contact window; similarly, a self-aligned metal silicide layer 311a is formed over the self-aligned source contact window by using the well-known self-aligned silicidation process; and subsequently, a source metal layer 312 is formed over the self-aligned metal silicide layer 311a, the sidewall dielectric spacer 310a, a top portion of the patterned protection dielectric layer 309d in the scalable source region (SR) and the patterned capping dielectric layer 304a in the planar gate region (GR).

From FIG. 4C, it is clearly seen that the protection dielectric layer 309 is used as an etching stop for forming the sidewall dielectric spacer 310a and provides a barrier for mobile ion contamination.

Figure 5A:
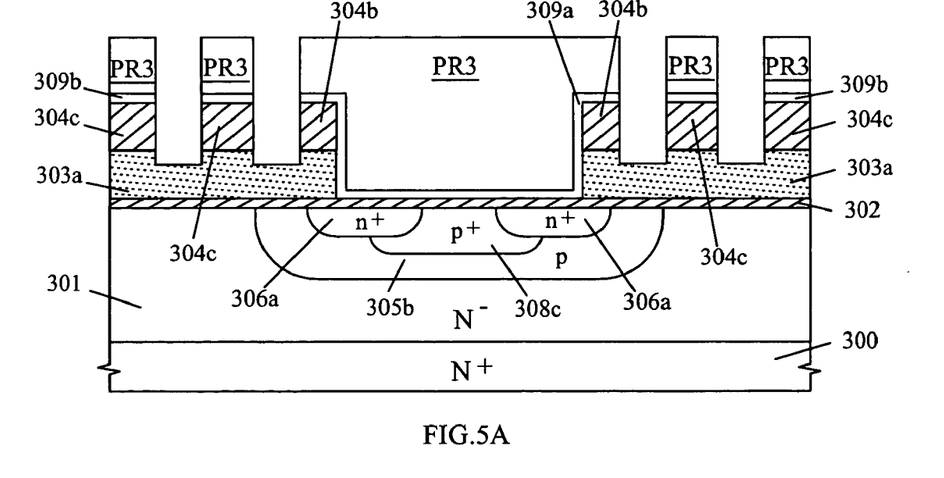
FIG. 5A through FIG. 5C show simplified process steps after FIG. 4A and their schematic cross-sectional views of fabricating a third-type scalable planar DMOS transistor structure of the present invention.
Figure 5B:
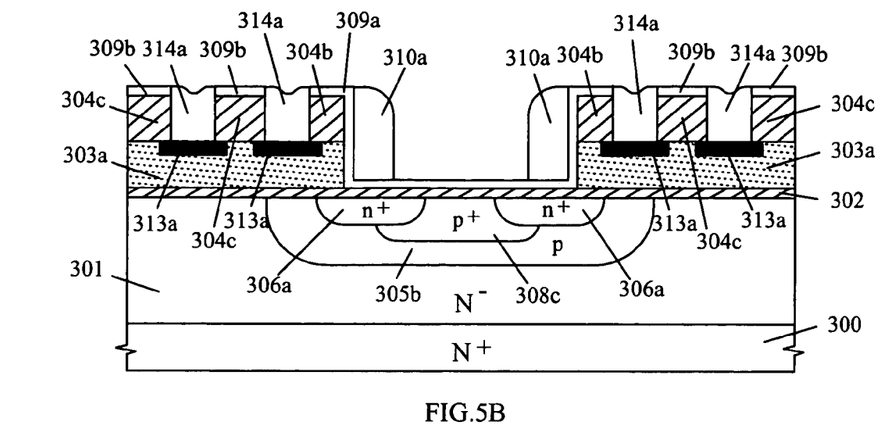
Figure 5C:
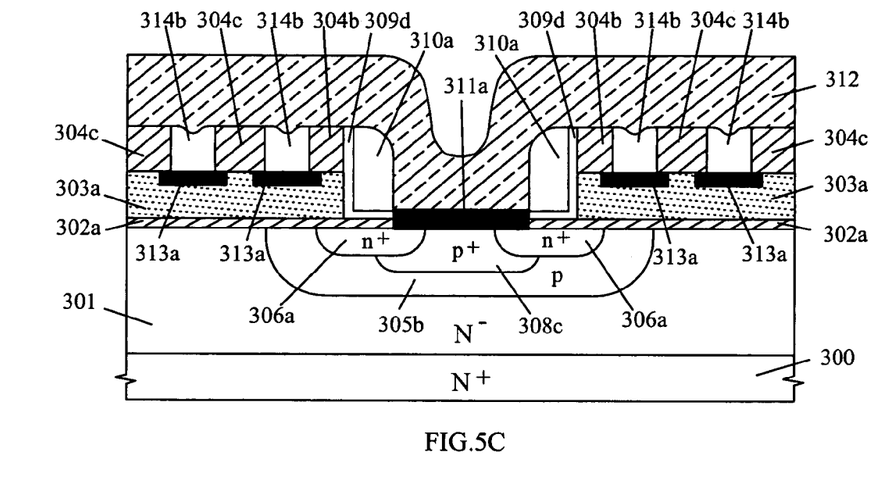

Referring now to FIG. 5A through FIG. 5C, there are shown simplified process steps after FIG. 4A and their cross-sectional views of fabricating a third-type scalable planar DMOS transistor structure of the present invention.

FIG. 5A shows that a third masking photoresist (PR3) step is performed to define patterned windows over the protection dielectric layer 309 shown in FIG. 4A; and subsequently, the protection dielectric layer 309 and the patterned capping dielectric layer 304a in the planar gate region (GR) outside of the patterned third masking photoresist (PR3) are sequentially removed by using anisotropic dry etching and the patterned heavily-doped polycrystalline-silicon gate layer 303a can be etched to form shallow trenches.

FIG. 5B shows that the patterned third masking photoresist (PR3) are removed; a well-known self-aligned silicidation process is performed to form metal-silicide layers 313a over the patterned heavily-doped polycrystalline-silicon gate layer 303a through the patterned windows; and subsequently, a sidewall dielectric spacer 310a is formed over a sidewall of the patterned protection dielectric layer 309a and on a side portion of the patterned protection dielectric layer 309a in the scalable source region (SR) and a refilled dielectric layer 314a is simultaneously formed to fill each gap formed in the patterned windows. The sidewall dielectric spacer 310a and the refilled dielectric layer 314a are preferably made of silicon dioxide as deposited by LPCVD and are formed by first depositing a silicon dioxide layer 310 (not shown) over a formed structure surface and then etching back a thickness of the deposited silicon dioxide layer 310. It should be noted that the width of the patterned window must be smaller than two times of the thickness of the deposited silicon dioxide layer 310.

FIG. 5C shows that the patterned protection dielectric layers 309a,309b are etched back by using anisotropic dry etching; and the gate dielectric layer 302 surrounded by the sidewall dielectric layer 310a is then removed by anisotropic dry etching to form a self-aligned source contact window and simultaneously the refilled dielectric layers 314a are also etched; and subsequently, a self-aligned metal silicide layer 311a is formed over the self-aligned source contact window and a source metal layer 312 is formed over the self-aligned metal silicide layer 311a, the sidewall dielectric spacer 310a, a top portion of the patterned protection dielectric layer 309d, the patterned capping dielectric layers 304b, 304c and the refilled dielectric layers 314b. Similarly, the self-aligned metal silicide layer 311a is preferably a refractory metal silicide layer and the source metal layer 312 comprises a metal layer over a barrier metal layer.

From FIG. 5C, it is clearly seen that the heavily-doped polycrystalline-silicon gate layer 303a being acted as a gate-interconnection conductive layer is locally silicided with metal silicide layers to reduce gate-interconnection parasitic resistance.

Figure 6:
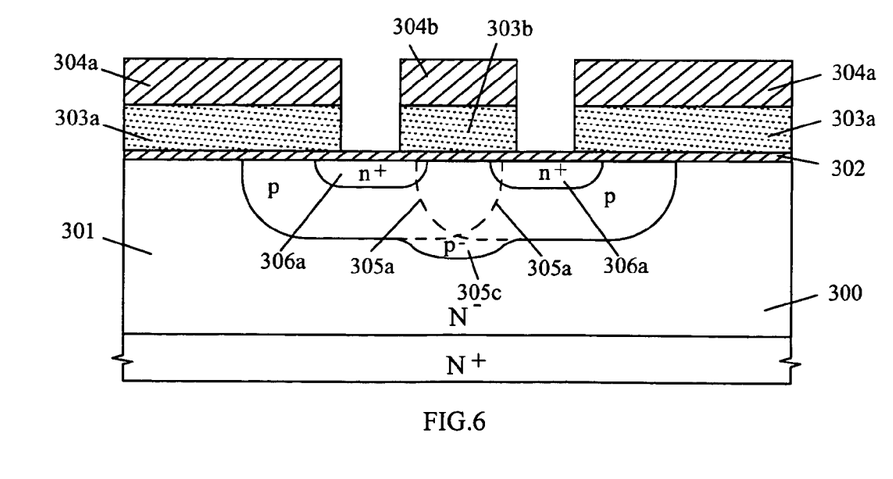
FIG. 6 shows a strongly cross-coupled p-diffusion ring for forming a moderately-doped p-base diffusion region with a p$^-$ diffusion region being formed in a middle portion beneath the moderately-doped p-base diffusion region.

As described in FIG. 3B, the moderately-doped p-base diffusion region 305b exhibits a flat junction depth for a critically cross-coupled p-diffusion ring 305a. FIG. 6 shows a moderately-doped p-base diffusion region 305c of a strongly cross-coupled p-diffusion ring 305a, which can be easily obtained as a junction depth of the p-diffusion ring 305a is approximately equal to or larger than a width surrounded by the ring-shaped implantation window (IW). It is clearly seen that a p-diffusion region will be formed in a middle portion beneath the p⁻ diffusion ring 305a to further improve breakdown voltage of a planar DMOS transistor cell. The moderately-doped p-base diffusion region 305c shown in FIG. 6 can be used to fabricate similar planar DMOS transistor structures shown in FIG. 3H, FIG. 4C and FIG. 5C.

Based on the above descriptions, the advantages and features of the present invention can be summarized below:

(a) The scalable planar DMOS transistor structure of the present invention offers a scalable source region with a heavily-doped n+ source diffusion ring and a heavily-doped p+contact diffusion region being fabricated without using critical masking photoresist steps to obtain device ruggedness.

(b) The scalable planar DMOS transistor structure of the present invention offers a self-aligned source contact window without using a masking photoresist step.

(c) The scalable planar DMOS transistor structure of the present invention offers a heavily-doped polycrystalline-silicon gate layer being locally silicided with metal silicide layers to reduce gate-interconnection parasitic resistance.

(d) The scalable planar DMOS transistor structure of the present invention offers a strongly cross-coupled p-diffusion region being formed in a middle portion beneath the moderately-doped p-base diffusion region to improve breakdown voltage of planar DMOS transistor cells.

Similarly, the scalable planar n-channel DMOS transistor structure and its fabricating methods as described can be extended to form scalable planar p-channel DMOS transistor structure by changing doping types in semiconductor regions. Moreover, the scalable planar DMOS transistor structure as described can be used to fabricate insulated-gate bipolar transistors (IGBT) and MOS-controlled thyristors (MCT).

While the present invention has been particularly shown and described with reference to the present examples and embodiments as considered as illustrative and not restrictive. Moreover, the present invention is not to be limited to the details given herein, it will be understood by those skilled in the art that various changes in forms and details may be made without departure from the true spirit and scope of the present invention.

What is claimed is:

1. A scaled planar DMOS transistor structure, comprising:
   a semiconductor substrate of a first conductivity type, wherein the semiconductor substrate comprises a lightly-doped epitaxial semiconductor layer being formed on a heavily-doped semiconductor substrate;
   a scalable source region being defined to be surrounded by a planar gate region, wherein the scalable source region comprises a moderately-doped base diffusion region of a second conductivity type being formed in the lightly-doped epitaxial semiconductor layer through a ring-shaped implantation window, a heavily-doped source diffusion ring of the first conductivity type being formed in a surface portion of the moderately-doped base diffusion region through the ring-shaped implantation window, a heavily-doped base contact diffusion region of the second conductivity type being formed in a middle surface portion of the moderately-doped base diffusion region through a self-aligned implantation window surrounded by a sacrificial dielectric layer being formed to fill a gap in the ring-shaped implantation window, and a self-aligned source contact window being formed on a semiconductor surface formed by the heavily-doped base contact diffusion region surrounded by the heavily-doped source diffusion ring and the heavily-doped source diffusion ring surrounded by a sidewall dielectric spacer;
   the planar gate region being formed on a gate dielectric layer outside of the scalable source region, wherein the planar gate region comprises a patterned heavily-doped polycrystalline-silicon gate layer being formed on the gate dielectric layer and a patterned capping dielectric layer being formed on the patterned heavily-doped polycrystalline-silicon gate layer; and
   a source metal layer being at least formed on the self-aligned source contact window.

2. The scalable planar DMOS transistor structure according to claim 1, wherein the semiconductor substrate is a single crystalline-silicon substrate.

3. The scalable planar DMOS transistor structure according to claim 1, wherein the ring-shaped implantation window is patterned by a first masking photoresist step through sequentially removing a capping dielectric layer on a heavily-doped polycrystalline-silicon layer in the ring-shaped implantation window and is refilled with the sacrificial dielectric layer after forming the heavily-doped source diffusion ring.

4. The scalable planar DMOS transistor structure according to claim 1, wherein the self-aligned implantation window is formed by sequentially removing the patterned capping dielectric layer on the patterned heavily-doped polycrystalline-silicon gate layer surrounded by the sacrificial dielectric layer in the ring-shaped implantation window through a second masking photoresist step.

5. The scalable planar DMOS transistor structure according to claim 1, wherein the sidewall dielectric spacer is formed over a sidewall of the patterned capping dielectric layer on the patterned heavily-doped polycrystalline-silicon gate layer in the planar gate region and on a side surface portion of the gate dielectric layer in the scalable source region.

6. The scalable planar DMOS transistor structure according to claim 1, wherein the sidewall dielectric spacer is formed over a sidewall of a protection dielectric layer being formed over a sidewall of the patterned capping dielectric layer on the patterned heavily-doped polycrystalline-silicon gate layer in the planar gate region and on a side surface portion of the protection dielectric layer being formed on the gate dielectric layer in the scalable source region.

7. The scalable planar DMOS transistor structure according to claim 1, wherein the patterned heavily-doped polycrystalline-silicon gate layer is locally silicided with metal silicide layers through gaps formed in the patterned capping dielectric layer and refilled dielectric layers are formed to fill the gaps.

8. The scalable planar DMOS transistor structure according to claim 1, wherein the moderately-doped base diffusion region is formed by a cross-coupled diffusion ring being formed through the ring-shaped implantation window.

9. The scalable planar DMOS transistor structure according to claim 1, wherein the source metal layer comprises a self-aligned metal silicide layer being formed over the self-aligned source contact window and a metal layer over a barrier metal layer being at least formed over the self-aligned metal silicide layer.

* * * * *